United States Patent
Hida et al.

(10) Patent No.: US 9,543,494 B2
(45) Date of Patent: Jan. 10, 2017

(54) THERMOELECTRIC CONVERSION MODULE AND METHOD OF MANUFACTURING THE SAME

(71) Applicant: FUJITSU LIMITED, Kawasaki-shi, Kanagawa (JP)

(72) Inventors: Masaharu Hida, Atsugi (JP); Kazunori Yamanaka, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 688 days.

(21) Appl. No.: 13/859,059

(22) Filed: Apr. 9, 2013

(65) Prior Publication Data

US 2014/0130838 A1 May 15, 2014

Related U.S. Application Data

(63) Continuation of application No. PCT/JP2010/069130, filed on Oct. 28, 2010.

(51) Int. Cl.
| | | |
|---|---|---|
| *H01L 35/32* | (2006.01) | |
| *H01L 35/08* | (2006.01) | |
| *H01L 35/22* | (2006.01) | |
| *H01L 35/34* | (2006.01) | |

(52) U.S. Cl.
CPC ............. *H01L 35/32* (2013.01); *H01L 35/08* (2013.01); *H01L 35/22* (2013.01); *H01L 35/34* (2013.01)

(58) Field of Classification Search
CPC combination set(s) only.
See application file for complete search history.

(56) References Cited

U.S. PATENT DOCUMENTS

| | | | |
|---|---|---|---|
| 2005/0115601 A1* | 6/2005 | Olsen | ............... H01L 35/16 136/212 |
| 2010/0012186 A1* | 1/2010 | Park | ............... H01L 35/32 136/259 |
| 2012/0018835 A1 | 1/2012 | Sawabe | |

FOREIGN PATENT DOCUMENTS

| | | |
|---|---|---|
| JP | H8-43555 | 2/1996 |
| JP | H8-148726 | 6/1996 |
| JP | H11-150308 | 6/1999 |
| JP | 2000-77731 | 3/2000 |

(Continued)

OTHER PUBLICATIONS

International Search Report for International Application No. PCT/JP2010/069130 dated Jan. 25, 2011.

*Primary Examiner* — Shannon Gardner
(74) *Attorney, Agent, or Firm* — Kratz, Quintos & Hanson, LLP

(57) ABSTRACT

A p-type semiconductor block is made of a p-type thermoelectric conversion material, and has a pillar portion and a connection portion laterally protruding from the pillar portion. In addition, an n-type semiconductor block is made of an n-type thermoelectric conversion material, and has a pillar portion and a connection portion laterally protruding from the pillar portion. The p-type semiconductor block and the n-type semiconductor block are alternately arranged in such a way that the connection portion of the p-type semiconductor block is connected with the pillar portion of the n-type semiconductor block and the connection portion of the n-type semiconductor block is connected with the pillar portion of the p-type semiconductor block. The connection portions and tip-end portions of the pillar portions are made of a thermoelectric conversion material containing metal powder.

11 Claims, 20 Drawing Sheets

(56) References Cited

FOREIGN PATENT DOCUMENTS

| JP | 2001-189497 A1 | 7/2001 |
|----|----------------|--------|
| JP | 2004-288819 A1 | 10/2004 |
| JP | 2005-5526 A1 | 1/2005 |
| JP | 2005-19767 A1 | 1/2005 |
| JP | 2008-16592 A1 | 1/2008 |
| JP | 2010-212339 A1 | 9/2010 |

* cited by examiner

THERMOELECTRIC CONVERSION MODULE AND METHOD OF MANUFACTURING THE SAME

CROSS-REFERENCE TO RELATED APPLICATION

This application is a continuation of International Patent Application No. PCT/JP2010/069130 filed Oct. 28, 2010 and designated the U.S., the entire contents of which are incorporated herein by reference.

FIELD

The embodiments discussed herein are related to a thermoelectric conversion module having a p-type semiconductor block made of a p-type thermoelectric conversion material and an n-type semiconductor block made of an n-type thermoelectric conversion material, and a method of manufacturing the thermoelectric conversion module.

BACKGROUND

Recently, thermoelectric conversion elements have attracted an attention from the viewpoints of $CO_2$ reduction and environmental protection. Using the thermoelectric conversion elements may enable thermal energy which has been a waste to be converted to electric energy for reuse. Since an output voltage of a single thermoelectric conversion element is low, a thermoelectric conversion module generally used is made by connecting a plurality of thermoelectric conversion elements in series.

A common thermoelectric conversion module has a structure in which many semiconductor blocks (hereinafter referred to as p-type semiconductor blocks) made of a p-type thermoelectric conversion material and many semiconductor blocks (hereinafter referred to as n-type semiconductor blocks) made of an n-type thermoelectric conversion material are held between two heat transfer plates. The p-type semiconductor blocks and the n-type semiconductor blocks are alternately arranged in the in-plane direction of the heat transfer plates and are connected in series through metal terminals disposed across each adjacent semiconductor blocks. An extraction electrode is connected to each of both ends of the serially-connected semiconductor blocks.

In the above-described thermoelectric conversion module, when a temperature difference is given to the two heat transfer plates, a potential difference is generated between the p-type semiconductor blocks and the n-type semiconductor blocks due to the Seebeck effect, which may enable electric power to be taken from the extraction electrodes. In addition, when a current is flowed through a thermoelectric conversion module with a pair of the extraction electrodes connected with a power source, heat may be transferred from one heat transfer plate to the other due to the Peltier effect.

In a general thermoelectric conversion module, as described above, a large number (several tens to several hundreds pairs) of p-type semiconductor blocks and n-type semiconductor blocks are used. Achieving a thermoelectric conversion module with a smaller size and higher performance uses a technique to miniaturize the p-type semiconductor blocks and the n-type semiconductor blocks as well as a technique to electrically connect these semiconductor blocks with each other.

According to a conventional common method of forming a thermoelectric conversion module, a semiconductor substrate (a thermoelectric conversion material substrate) is cut into a large number of semiconductor blocks by a dicing saw and these semiconductor blocks are arranged on a heat transfer plate. In addition, a metal terminal to electrically connect the semiconductor blocks with each other is formed of a metal thin film or a conductive paste.

PATENT DOCUMENT 1: Japanese Laid-open Patent Publication No. 08-43555
PATENT DOCUMENT 2: Japanese Laid-open Patent Publication No. 2004-288819
PATENT DOCUMENT 3: Japanese Laid-open Patent Publication No. 2005-5526
PATENT DOCUMENT 4: Japanese Laid-open Patent Publication No. 2005-19767

To manufacture a conventional thermoelectric conversion module, a process of cutting a semiconductor substrate into a large number of semiconductor blocks, a process of forming metal terminals, and a process of electrically connecting the semiconductor blocks with the metal terminals. This increases the number of manufacturing processes and thus increases a production cost.

SUMMARY

According to a first aspect of the embodiments, a thermoelectric conversion module includes: a plurality of p-type semiconductor blocks, each being made of a p-type thermoelectric conversion material, each having a first pillar portion and a first connection portion laterally protruding from one end portion of the first pillar portion, and each containing metal powder in the first connection portion and a different end portion of the first pillar portion; and a plurality of n-type semiconductor blocks, each being made of an n-type thermoelectric conversion material, each having a second pillar portion and a second connection portion laterally protruding from one end portion of the second pillar portion, and each containing metal powder in the second connection portion and a different end portion of the second pillar portion. In the thermoelectric conversion module, the first connection portion of each p-type semiconductor block is connected with the different end portion of the second pillar portion of the corresponding n-type semiconductor block, the second connection portion of each n-type semiconductor block is connected with the different end portion of the first pillar portion of the corresponding p-type semiconductor block, so that the plurality of p-type semiconductor blocks and the plurality of n-type semiconductor blocks are alternately connected in series.

Meanwhile, according to a second aspect of the embodiments, a method of manufacturing a thermoelectric conversion module includes: preparing a first substrate having a laminated structure of a first p-type thermoelectric conversion material layer made of a p-type thermoelectric conversion material and a second p-type thermoelectric conversion material layer made of a p-type thermoelectric conversion material containing metal powder and disposed on each of upper and lower sides of the first p-type thermoelectric conversion material layer; preparing a second substrate having a laminated structure of a first n-type thermoelectric conversion material layer made of an n-type thermoelectric conversion material and a second n-type thermoelectric conversion material layer made of an n-type thermoelectric conversion material containing metal powder and disposed on each of upper and lower sides of the first n-type thermoelectric conversion material layer; providing a groove in the first substrate in a lattice pattern to thereby form a first pillar portion surrounded by the groove, and providing a groove in the second substrate in a lattice pattern to thereby form a second pillar portion surrounded by the groove; forming a bonded substrate by overlapping the first substrate and the second substrate with each other in such a way that surfaces of the first substrate and the second substrate with the grooves face inside and that the first pillar portion and the second pillar portion are alternately arranged, and then bonding the first pillar portion and a groove portion of the second substrate as well as the second pillar portion and a groove portion of the first substrate; and providing a slit in each of the groove portion of the first substrate and the groove portion of the second substrate of the bonded substrate to thereby obtain a structure in which a p-type semiconductor block made of the p-type thermoelectric conversion material and an n-type semiconductor block made of the n-type thermoelectric conversion material are alternately connected in series.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Hereinafter, the embodiments are described with reference to accompanying drawings.

(First Embodiment)

Figure 1:
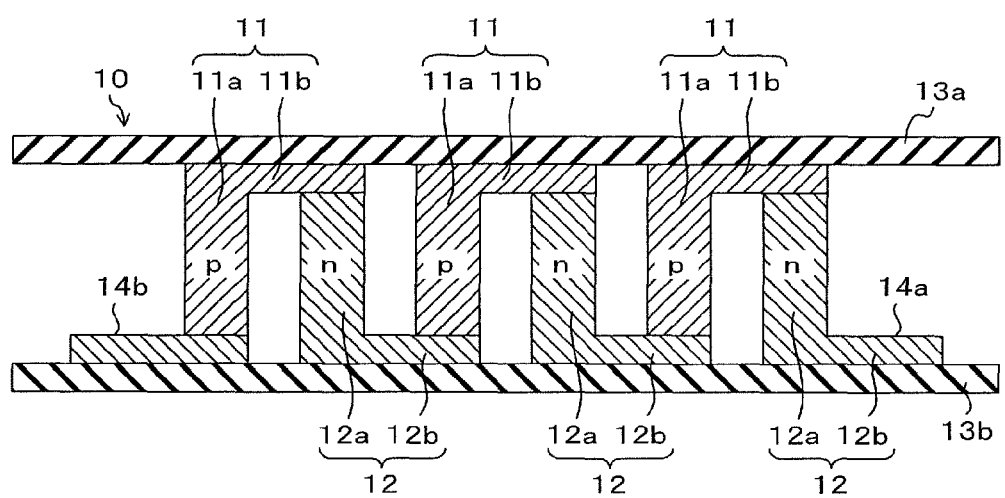
FIG. 1 is a schematic cross-sectional drawing illustrating a thermoelectric conversion module according to a first embodiment.

FIG. 1 is a schematic cross-sectional drawing illustrating a thermoelectric conversion module according to a first embodiment.

As illustrated in FIG. 1, a thermoelectric conversion module 10 according to the embodiment has two heat transfer plates 13a, 13b, and a plurality of p-type semiconductor blocks 11 and a plurality of n-type semiconductor blocks 12 which are disposed between the heat transfer plates 13a, 13b. For example, each p-type semiconductor block 11 is made of a p-type thermoelectric conversion material such as $Ca_3Co_4O_9$ and each n-type semiconductor block 12 is made of an n-type thermoelectric conversion material such as $Ca_{0.9}La_{0.1}MnO_3$.

The p-type semiconductor block 11 is formed in a substantially "L"-letter shape and has a quadrangular pillar shape pillar portion 11a and a thin plate shape connection portion 11b laterally protruding from an end portion of the pillar portion 11a. As similar to this, the n-type semiconductor block 12 is also formed in a substantially "L"-letter shape and has a quadrangular pillar shape pillar portion 12a and a thin plate shape connection portion 12b laterally protruding from an end portion of the pillar portion 12a.

In the thermoelectric conversion module 10 illustrated in FIG. 1, the connection portions 11b of the p-type semiconductor blocks 11 are disposed on the side of one heat transfer plate 13a and the connection portions 12b of the n-type semiconductor blocks 12 are disposed on the side of the other heat transfer plate 13b. In addition, the connection portions 11b of the p-type semiconductor blocks 11 overlap with end portions (the end portions which are on the opposite side of the connection portions 12b) of the pillar portions 12a of the n-type semiconductor blocks 12 and the connection portions 12b of the n-type semiconductor blocks 12 overlap with end portions (the end portions which are on the opposite side of the connection portions 11b) of the pillar portions 11a of the p-type semiconductor blocks 11. In this manner, the p-type semiconductor blocks 11 and the n-type semiconductor blocks 12 are alternately connected in series.

The heat transfer plates 13a, 13b are each a plate-shaped member made of a good heat conductive material such as aluminum or copper, and at least their surfaces in contact with the semiconductor blocks 11, 12 are subjected to an insulating process.

In the thermoelectric conversion module 10 illustrated in FIG. 1, the connection portion 12b of the rightmost n-type semiconductor block serves as one extraction electrode 14a and the n-type semiconductor thin plate connecting to the pillar portion 11a of the leftmost p-type semiconductor block 11 serves as the other extraction electrode 14b.

In the thermoelectric conversion module 10 having the structure as described above, when a temperature difference is applied between the heat transfer plates 13a, 13b, a current flows through the p-type semiconductor blocks 11 and the n-type semiconductor blocks 12, and electric power may be taken out from the extraction electrodes 14a, 14b. Note that the thermoelectric conversion module 10 may be also used as a Peltier element. Specifically, when a voltage is applied to the extraction electrodes 14a, 14b from a power source, heat may be transferred from the heat transfer plate 13a to the heat transfer plate 13b (or in the reverse direction thereof).

Figure 2:
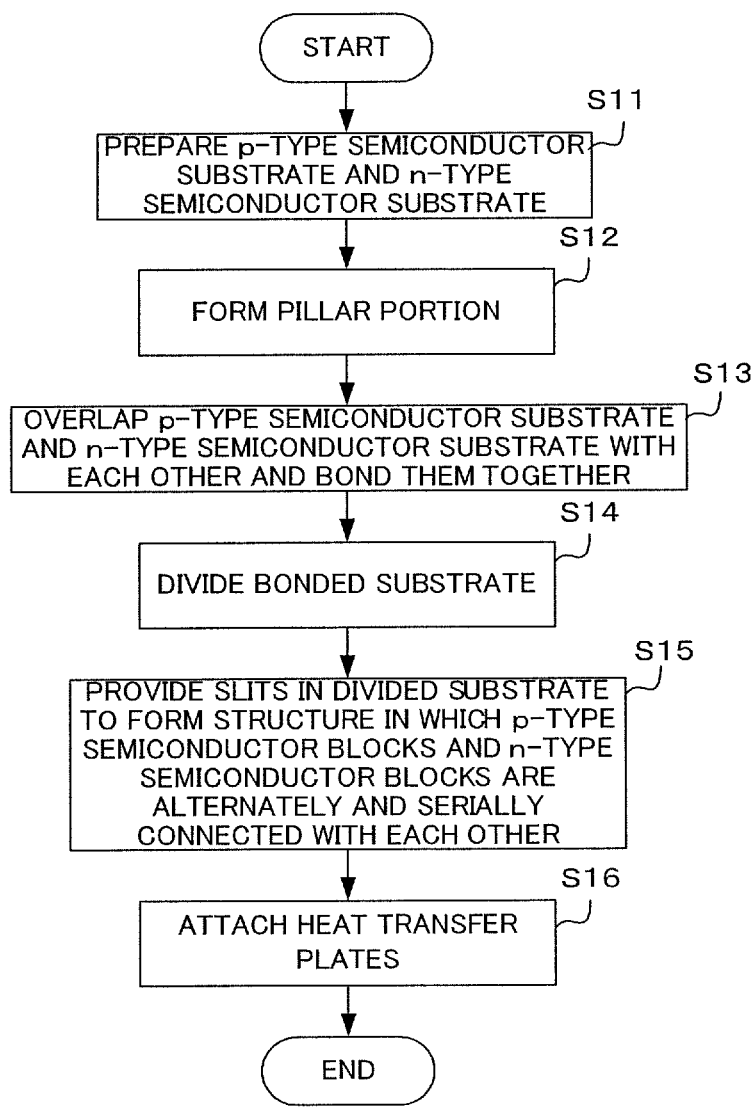
FIG. 2 is a flowchart illustrating a method of manufacturing the thermoelectric conversion module according to the first embodiment.

FIG. 2 is a flowchart illustrating a method of manufacturing the thermoelectric conversion module according to the embodiment. FIGS. 3, 4A, 4B, 5A, 5B, 6, 7 and 8 are drawings which illustrate the method of manufacturing the thermoelectric conversion module according to the embodiment in the order of steps taken.

Figure 3:
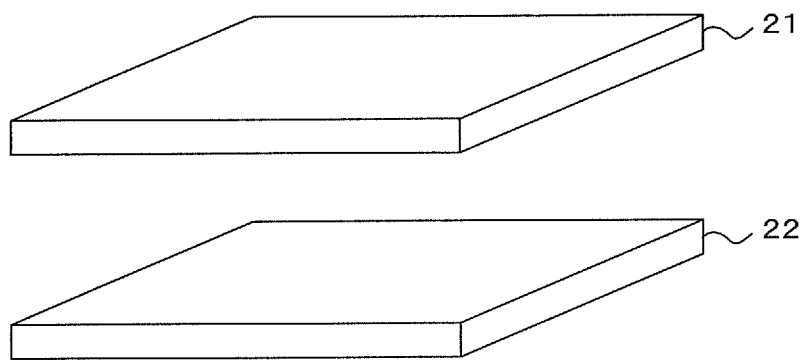
FIG. 3 is a drawing (No. 1) illustrating the method of manufacturing the thermoelectric conversion module according to the first embodiment.

First, at step S11, as illustrated in FIG. 3, a p-type semiconductor substrate (a p-type thermoelectric conversion material substrate) 21 to form p-type semiconductor blocks 11 and an n-type semiconductor substrate (an n-type thermoelectric conversion material substrate) 22 to form n-type semiconductor blocks 12 are prepared.

In the embodiment, the p-type semiconductor substrate 21 and the n-type semiconductor substrate 22 each have a thickness of 900 μm. Also, the p-type semiconductor substrate 21 is made of $Ca_3Co_4O_9$ and the n-type semiconductor substrate 22 is made of $Ca_{0.9}La_{0.1}MnO_3$. However, the materials of the p-type semiconductor substrate 21 and the n-type semiconductor substrate 22 are not limited to the above, but other thermoelectric conversion materials may be naturally used. The p-type thermoelectric conversion materials include $Na_xCoO_2$ and $Ca_{3-x}Bi_xCo_4O_9$ in addition to $Ca_3Co_4O_9$. Also, the n-type thermoelectric conversion materials include $La_{0.9}Bi_{0.1}NiO_3$, $CaMn_{0.98}Mo_{0.02}O_3$, and Nb-doped $SrTiO_3$ in addition to $Ca_{0.9}La_{0.1}MnO_3$.

Figure 4A:
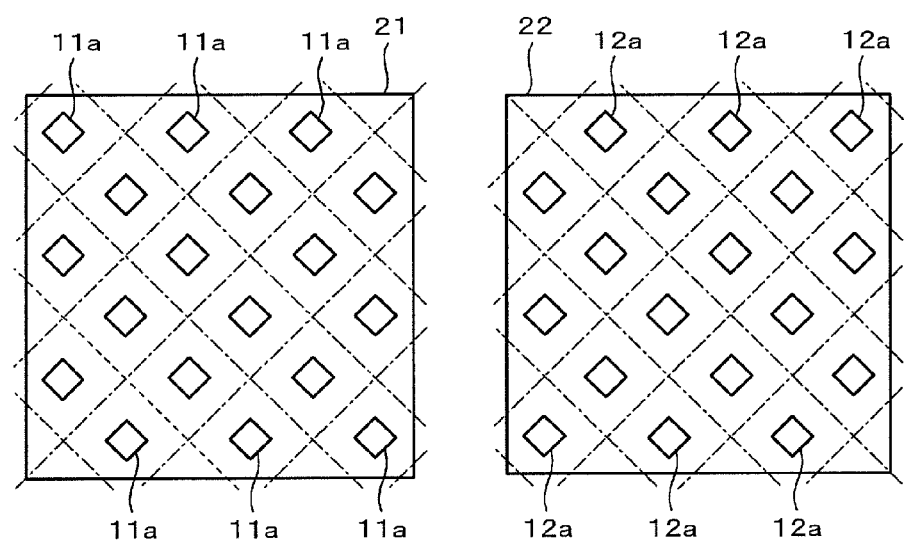
FIG. 4A and FIG. 4B are drawings (No. 2) illustrating the method of manufacturing the thermoelectric conversion module according to the first embodiment.
Figure 4B:
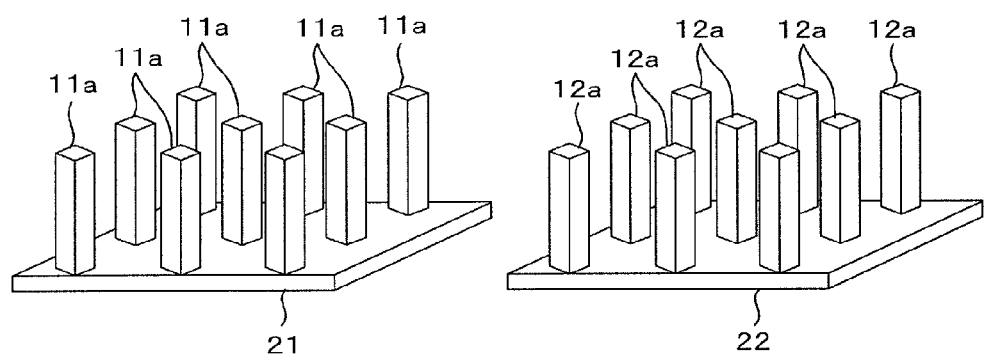

Next, at step S12, as illustrated in a plan view of FIG. 4A and a perspective view of FIG. 4B, slits (grooves) with a depth of 800 μm, for example, are provided in a lattice pattern in the p-type semiconductor substrate 21 by a dicing saw. In FIG. 4A, dashed lines schematically illustrate positions where the dicing saw passes. A portion surrounded by the slits becomes a pillar portion 11a of each p-type semiconductor block 11. In addition, the thickness of the p-type semiconductor substrate 21 left in a slit portion (a groove bottom portion) is approximately 100 μm. Hereinafter, the semiconductor substrate in this slit portion is referred to as a thin plate portion. A part of this thin plate portion becomes connection portions 11b of the p-type semiconductor blocks 11 in a later step.

In the embodiment, a size of each pillar portion 11a is 100 μm×100 μm when it is seen from above as illustrated in FIG. 4A. In addition, a height of the pillar portion 11a is 800 μm and a gap between the adjacent pillar portions 11a (a gap in a parallel direction with the dashed line of FIG. 4A) is 200 μm. The gap between the pillar portions 11a may be adjusted by, for example, a thickness of a blade of the dicing saw or the number of slits.

Similarly, slits (grooves) with a depth of 800 μm are also provided in a lattice pattern in the n-type semiconductor substrate 22, so that pillar portions 12a of the n-type semiconductor blocks 12 are formed. As similar to the pillar portion 11a, a size of each pillar portion 12a is 100 μm×100 μm, a height of the pillar portion 12a is 800 μm and a gap between the adjacent pillar portions 12a is 200 μm. Note that in the embodiment, the pillar portions 11a, 12a are formed by providing slits in the semiconductor substrates 21, 22 by the dicing saw, but the pillar portions 11a, 12a may be formed by providing grooves in the semiconductor substrates 21, 22 with another method such as blasting.

Figure 5A:
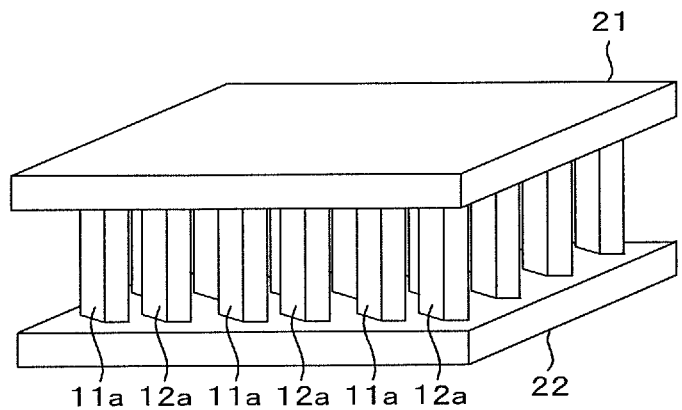
FIG. 5A and FIG. 5B are drawings (No. 3) illustrating the method of manufacturing the thermoelectric conversion module according to the first embodiment.

Next, at step S13, as illustrated in the perspective view of FIG. 5A, the p-type semiconductor substrate 21 and the n-type semiconductor substrate 22 are overlapped with each other. At this time, the p-type semiconductor substrate 21 and the n-type semiconductor substrate 22 are disposed in such a way that their surfaces with the slits face each other. In addition, as schematically illustrated in FIG. 5B, the pillar portions 11a of the p-type semiconductor blocks 11 and the pillar portions 12a of the n-type semiconductor blocks 12 are inserted into gaps between themselves to be alternately disposed in the longitudinal direction and the lateral direction.

Figure 5B:
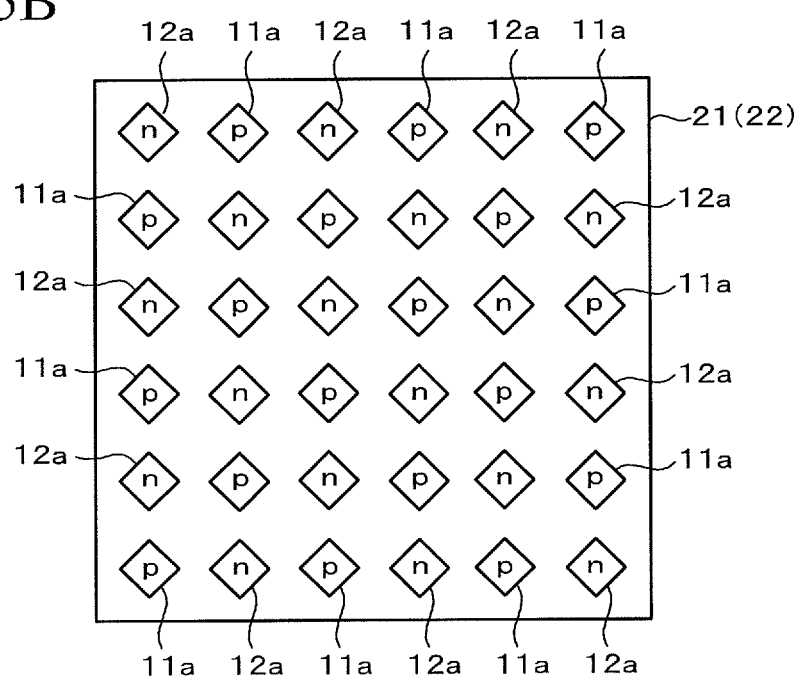

As it is seen from FIG. 5B, in the embodiment, each adjacent set of the p-type semiconductor block 11 and the n-type semiconductor block 12 has a structure in which corner portions of the pillar portions 11a, 12a face each other.

Figure 6:
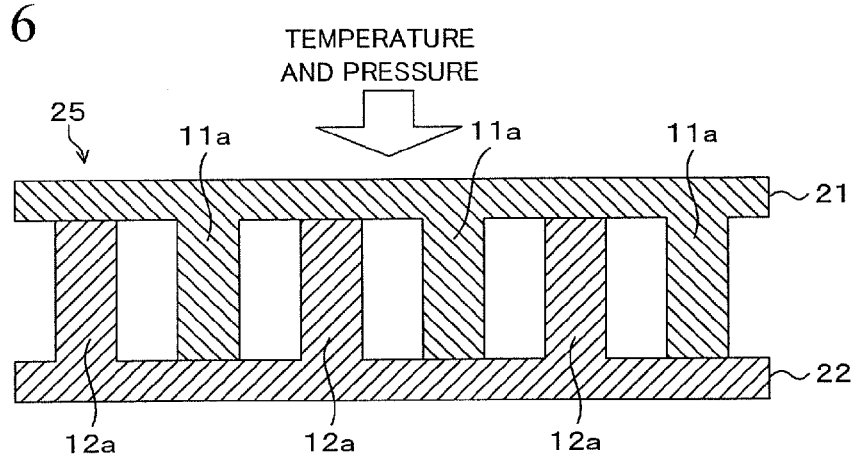
FIG. 6 is a drawing (No. 4) illustrating the method of manufacturing the thermoelectric conversion module according to the first embodiment.

Thereafter, as schematically illustrated in FIG. 6, a temperature and a pressure are applied by hot pressing to the p-type semiconductor substrate 21 and the n-type semiconductor substrate 22 to bond (thermal compression bond) these substrates together. In the process of this hot pressing, a tip end of the pillar portion 11a is bonded to the thin plate portion of the n-type semiconductor substrate 22 and a tip end of the pillar portion 12a is bonded to the thin plate portion of the p-type semiconductor substrate 21. The hot pressing is conducted under conditions where a pressure is 10 MPa to 50 MPa and a temperature is 900° C. to 1000° C., for example. Other conditions may be employed as the conditions for the hot pressing, but it is important that the pillar portions 11a, 12a and the thin plate portions of the semiconductor substrates 21, 22 be electrically bonded in a good condition. Hereinafter, a structure formed of the two semiconductor substrates 21, 22 bonded together is referred to as a bonded substrate 25.

Figure 7:
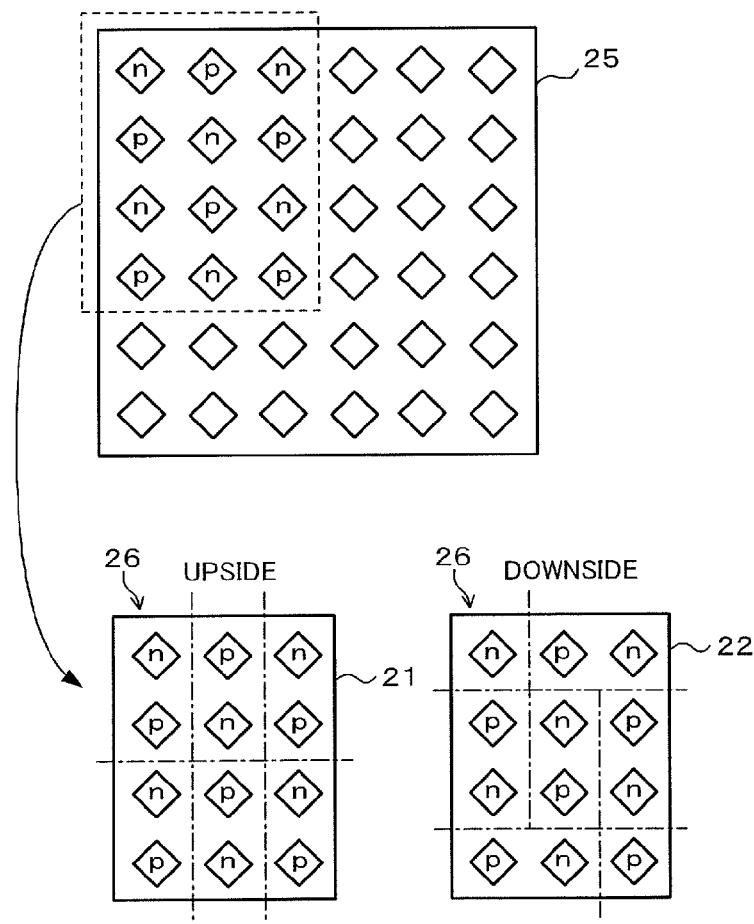
FIG. 7 is a drawing (No. 5) illustrating the method of manufacturing the thermoelectric conversion module according to the first embodiment.

Next, at step S14, as illustrated in FIG. 7, the bonded substrate 25 is cut into pieces of a desired size. Then, the step proceeds to step S15 where slits are provided in each of the thin plate portions of the p-type semiconductor substrate 21 and the n-type semiconductor substrate 22 by the dicing saw so that the p-type semiconductor blocks 11 and the n-type semiconductor blocks 12 are alternately connected in series. Parts of the thin film portions of the p-type semiconductor substrate 21 and the n-type semiconductor substrate 22 which are remaining after this process become the connection portions 11b, 12b.

Note that in FIG. 7, a rectangular portion surrounded by a broken line is cut out from the bonded substrate 25. Then, the slits (as illustrated by the dashed lines in FIG. 7) are individually provided to each of the p-type semiconductor substrate 21 and the n-type semiconductor substrate 22, thereby forming a semiconductor block set 26 with a structure in which the p-type semiconductor blocks 11 and the n-type semiconductor blocks 12 are alternately connected in series. The slit may be provided using other machining apparatuses such as an ultrasonic machining apparatus and a laser dicing apparatus, in place of the dicing saw.

As it is seen from FIGS. 4A, 4B and 7, in the embodiment, extending directions of the slits (grooves) formed when the pillar portions 11a, 12a are formed (directions of the dashed lines in FIG. 4A) and cutting directions in which the slits are provided in the bonded substrate 25 (directions of the dashed lines in FIG. 7) intersect with each other at an angle of 45°.

Figure 8:
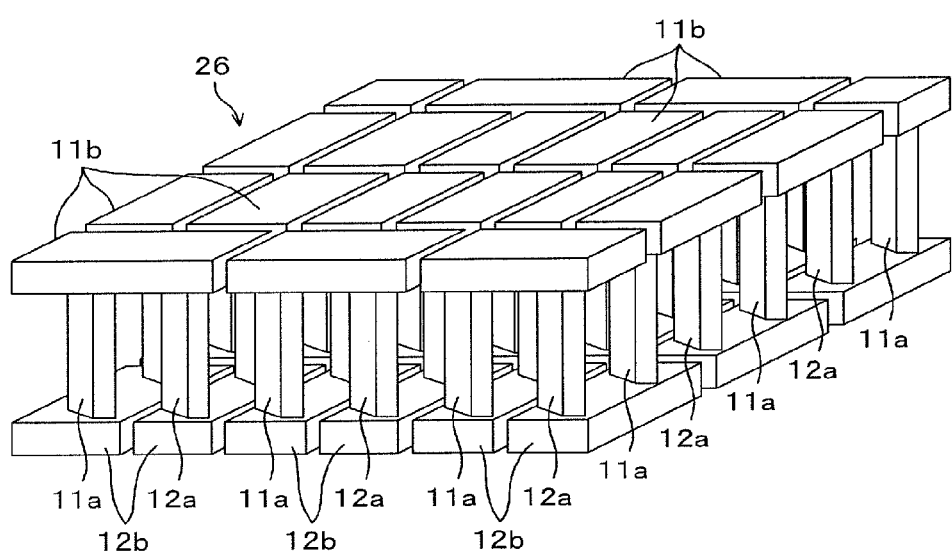
FIG. 8 is a drawing (No. 6) illustrating the method of manufacturing the thermoelectric conversion module according to the first embodiment.

FIG. 8 is a perspective view illustrating the semiconductor block set 26 after slits are provided so that the semiconductor blocks 11, 12 are alternately connected in series. At step S16, heat transfer plates 13a, 13b are attached to the semiconductor block set 26 by a thermal conductive adhesive, for example, so that the thermoelectric conversion module 10 according to the embodiment as illustrated in FIG. 1 is completed. Note that in place of attaching the heat transfer plates 13a, 13b, the semiconductor block set 26 may be directly attached to an electronic apparatus or the like as a heat source to be used as a thermoelectric conversion module.

The inventors of this application and the like actually manufacture a thermoelectric conversion module by the above-described method, and study a thermoelectric power generation characteristic thereof. A size of the thermoelectric conversion module is approximately 2 mm×2 mm and a thickness thereof is approximately 1 mm. In addition, the number of the p-type semiconductor blocks 11 and the number of the n-type semiconductor blocks 12 are both 100 (100 pairs). A temperature on one heat transfer plate side of the thermoelectric conversion module is a room temperature and a temperature on the other heat transfer plate side is a temperature which is 10° C. lower than the room temperature. As a result, a voltage of approximately 0.1V is generated between output terminals.

As illustrated in FIG. 1, the thermoelectric conversion module 10 according to the embodiment has the p-type semiconductor blocks 11 and the n-type semiconductor blocks 12 which are directly bonded together. Thus, metal terminals for electrically connecting the p-type semiconductor blocks 11 and the n-type semiconductor blocks 12 are not used. In addition, according to the embodiment, a step of individually cutting out semiconductor blocks or a step of individually arranging these semiconductor blocks are not performed. Accordingly, the method of manufacturing a thermoelectric conversion module according to the embodiment has less manufacturing processes, and thus may reduce the production cost of the thermoelectric conversion module.

(Second Embodiment)

Figure 9:
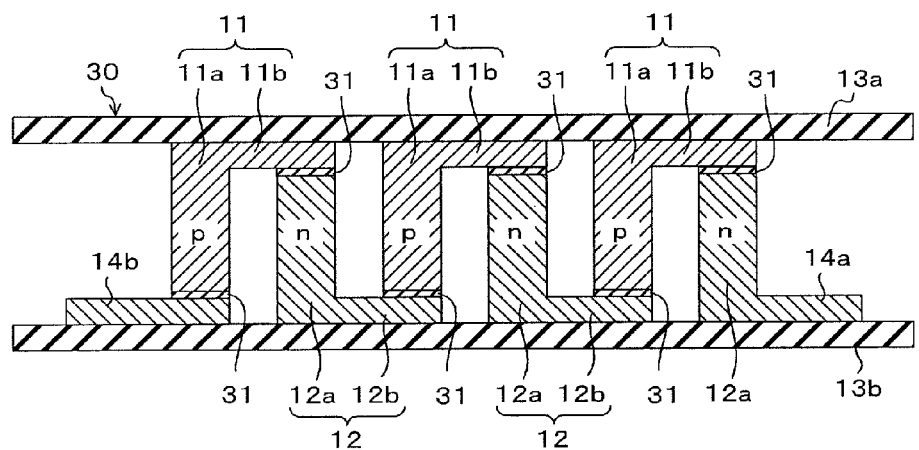
FIG. 9 is a schematic diagram illustrating a thermoelectric conversion module according to a second embodiment.

FIG. 9 is a schematic diagram illustrating a thermoelectric conversion module according to a second embodiment. The embodiment is different from the first embodiment in that a metal layer 31 is provided in each bonded portion of p-type semiconductor blocks 11 and n-type semiconductor blocks 12. Other structures are basically the same as those of the first embodiment. Accordingly, components in FIG. 9 which are the same as those in FIG. 1 are given the same reference numerals, and the detailed description thereof is omitted.

In the thermoelectric conversion module 10 according to the first embodiment, the p-type semiconductor blocks 11 and the n-type semiconductor blocks 12 are directly bonded together. Thus, depending on which thermoelectric conversion material is used, an element in the p-type semiconductor blocks 11 may spread into the n-type semiconductor blocks 12 or an element in the n-type semiconductor blocks 12 may spread into the p-type semiconductor blocks 11. This may deteriorate a thermoelectric conversion efficiency of the thermoelectric conversion module 10 or cause a trouble of increasing an electric resistance of the bonded portion.

On the other hand, in a thermoelectric conversion module 30 according to the embodiment, a metal layer 31 made of Ag (silver) or the like is provided in connection portions of p-type semiconductor blocks 11 and n-type semiconductor blocks 12, so that elements of the p-type semiconductor blocks 11 and the n-type semiconductor blocks 12 are prevented from migrating into the other block. Accordingly, an electric characteristic of the connection portion between the p-type semiconductor blocks 11 and the n-type semiconductor blocks 12 is stabilized, and thus the reliability of the thermoelectric conversion module is improved.

A method of manufacturing the thermoelectric conversion module 30 according to the embodiment is described below by referring to FIGS. 10, 11, 12A, 12B and 13. In these FIGS. 10, 11, 12A, 12B and 13, the same reference numerals are given to components which are the same as those of FIGS. 3, 4A, 4B, 5A, 5B, 6, 7 and 8.

Figure 10:
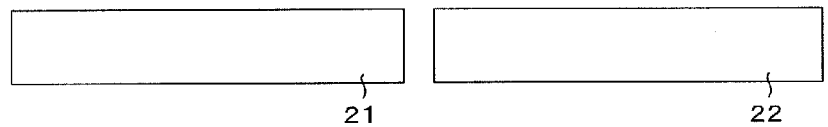
FIG. 10 is a drawing (No. 1) illustrating a method of manufacturing the thermoelectric conversion module according to the second embodiment.

First, as illustrated in the cross-sectional view of FIG. 10, a p-type semiconductor substrate 21 made of a p-type thermoelectric conversion material such as $Ca_3Co_4O_9$ and an n-type semiconductor substrate 22 made of an n-type thermoelectric conversion material such as $Ca_{0.9}La_{0.1}MnO_3$ are prepared. In the embodiment, thicknesses of the p-type semiconductor substrate 21 and the n-type semiconductor substrate 22 are both 900 μm.

Figure 11:
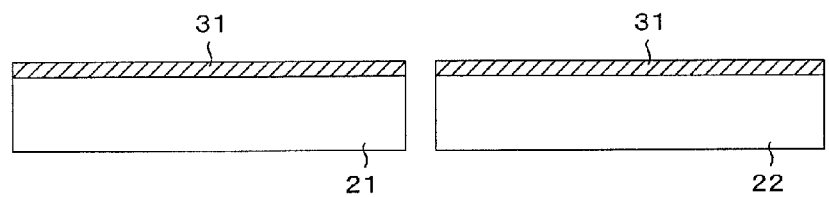
FIG. 11 is a drawing (No. 2) illustrating the method of manufacturing the thermoelectric conversion module according to the second embodiment.

Next, as illustrated in the cross-sectional view of FIG. 11, a metal layer 31 is formed on each of the p-type semiconductor substrate 21 and the n-type semiconductor substrate 22 with a thickness of, for example, 2 μm. In the embodiment, a metal layer 31 is formed in such a manner that Ag is deposited with a thickness of 0.5 μm by a vacuum deposition method, and then Ag paste is applied thereon with a thickness of 1.5 μm. After that, heat treatment is performed for approximately 10 minutes at a temperature of 800° C., for example. Note that in the embodiment, the metal layer 31 is made of Ag, but the metal layer 31 may be made of Au (gold) or solder.

Figure 12A:
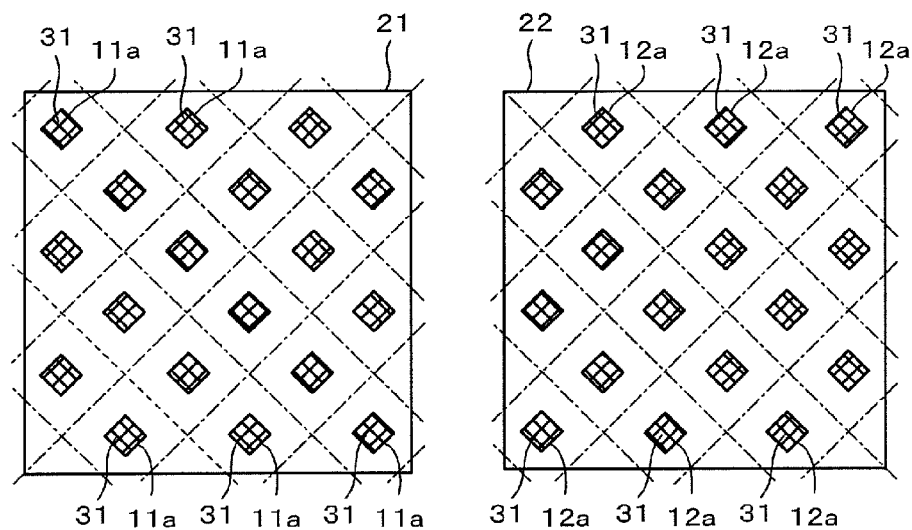
FIG. 12A and FIG. 12B are drawings (No. 3) illustrating the method of manufacturing the thermoelectric conversion module according to the second embodiment.
Figure 12B:
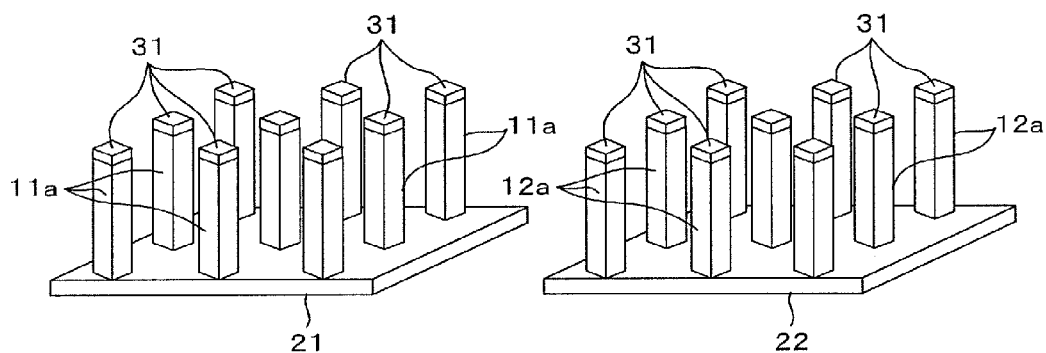

Next, as illustrated in a top view of FIG. 12A and a perspective view of FIG. 12B, slits (grooves) with a depth of 800 μm are provided in a lattice pattern in each of the p-type semiconductor substrate 21 and the n-type semiconductor substrate 22 by a dicing saw. A quadrangular pillar portion surrounded by the slits (the grooves) in the p-type semiconductor substrate 21 becomes a pillar portion 11a of each p-type semiconductor block 11 and a quadrangular pillar portion surrounded by the slits (the grooves) in the n-type semiconductor substrate 22 becomes a pillar portion 12a of each n-type semiconductor block 12. These pillar portions 11a, 12a are each covered with the metal layer 31.

Figure 13:
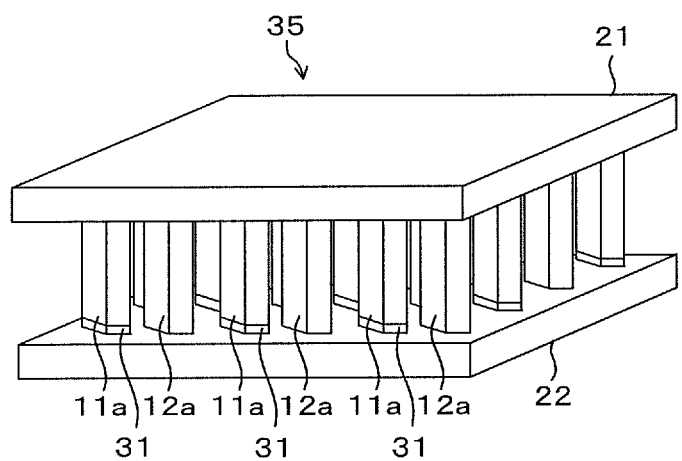
FIG. 13 is a drawing (No. 4) illustrating the method of manufacturing the thermoelectric conversion module according to the second embodiment.

Next, as illustrated in FIG. 13, the p-type semiconductor substrate 21 and the n-type semiconductor substrate 22 are overlapped with each other. At this time, the p-type semiconductor substrate 21 and the n-type semiconductor substrate 22 are disposed in such a way that their surfaces with the slits face each other. In addition, the pillar portions 11a of the p-type semiconductor blocks 11 and the pillar portions 12a of the n-type semiconductor blocks 12 are inserted into gaps between themselves to be alternately disposed in the longitudinal direction and the lateral direction.

Then, heat treatment is performed at a temperature of 700° C. to 900° C., for example, and the p-type semiconductor substrate 21 and the n-type semiconductor substrate 22 are bonded together with the metal layer 31 in between, thereby forming a bonded substrate 35. In this case, a large pressure is not used to be applied to the semiconductor substrates 21, 22, but it is preferable to apply a certain level of pressure for increasing bonding strength. Also, as similar to the first embodiment, the p-type semiconductor substrate 21 and the n-type semiconductor substrate 22 may be bonded together by heating them up to approximately 900° C. to 1000° C. while a pressure of approximately 10 MPa to 50 MPa is being applied by means of hot pressing.

Thereafter, as similar to the first embodiment, the bonded substrate 35 is cut into pieces of a desired size. Then, slits are provided in each of the thin plate portions of the p-type semiconductor substrate 21 and the n-type semiconductor substrate 22 by the dicing saw or the like so that the p-type semiconductor blocks 11 and the n-type semiconductor blocks 12 are alternately connected in series, thereby forming a semiconductor block set. After that, heat transfer plates 13a, 13b are attached to the semiconductor block set by a thermal conductive adhesive, for example, so that the thermoelectric conversion module 30 according to the embodiment as illustrated in FIG. 9 is completed.

In the embodiment, as described above, the metal layer 31 has a function to prevent the elements of the p-type semiconductor blocks 11 and the n-type semiconductor blocks 12 from spreading into the other block, but also has an effect of improving the reliability of the connection portions of the semiconductor blocks 11, 12.

Specifically, the depths of slits (grooves) formed by the dicing saw may vary. In the embodiment, the p-type semiconductor substrate 21 and the n-type semiconductor substrate 22 are bonded together with the metal layer 31 in between, so that the variations of the slit depths are absorbed by the metal layer 31 as a buffer and the p-type semiconductor substrate 21 and the n-type semiconductor substrate 22 may be connected with each other. As a result, the reliability of the connection portions of the semiconductor blocks 11, 12 is improved.

Note that, Ag paste may be applied onto the metal layer 31 before the p-type semiconductor substrate 21 and the n-type semiconductor substrate 22 are bonded together. With this process, the p-type semiconductor substrate 21 and the n-type semiconductor substrate 22 may be connected even when the slit depths greatly vary. In addition, a conductive bonding layer may be formed on the pillar portions 11a, 12a by a conductive material such as Ag paste without forming the metal layer 31 before the p-type semiconductor substrate 21 and the n-type semiconductor substrate 22 are bonded together.

The thermoelectric conversion module according to the embodiment is actually manufactured and the thermoelectric power generation characteristic thereof is studied. A size of the thermoelectric conversion module is approximately 2 mm×2 mm and a thickness thereof is approximately 1 mm. In addition, the number of the p-type semiconductor blocks 11 and the number of the n-type semiconductor blocks 12 are both 100 (100 pairs). A temperature on one heat transfer plate side of the thermoelectric conversion module is a room temperature and a temperature on the other heat transfer plate side is a temperature which is 10° C. lower than the room temperature. As a result, a voltage of approximately 0.1V is generated between output terminals.

(Third Embodiment)

Figure 14:
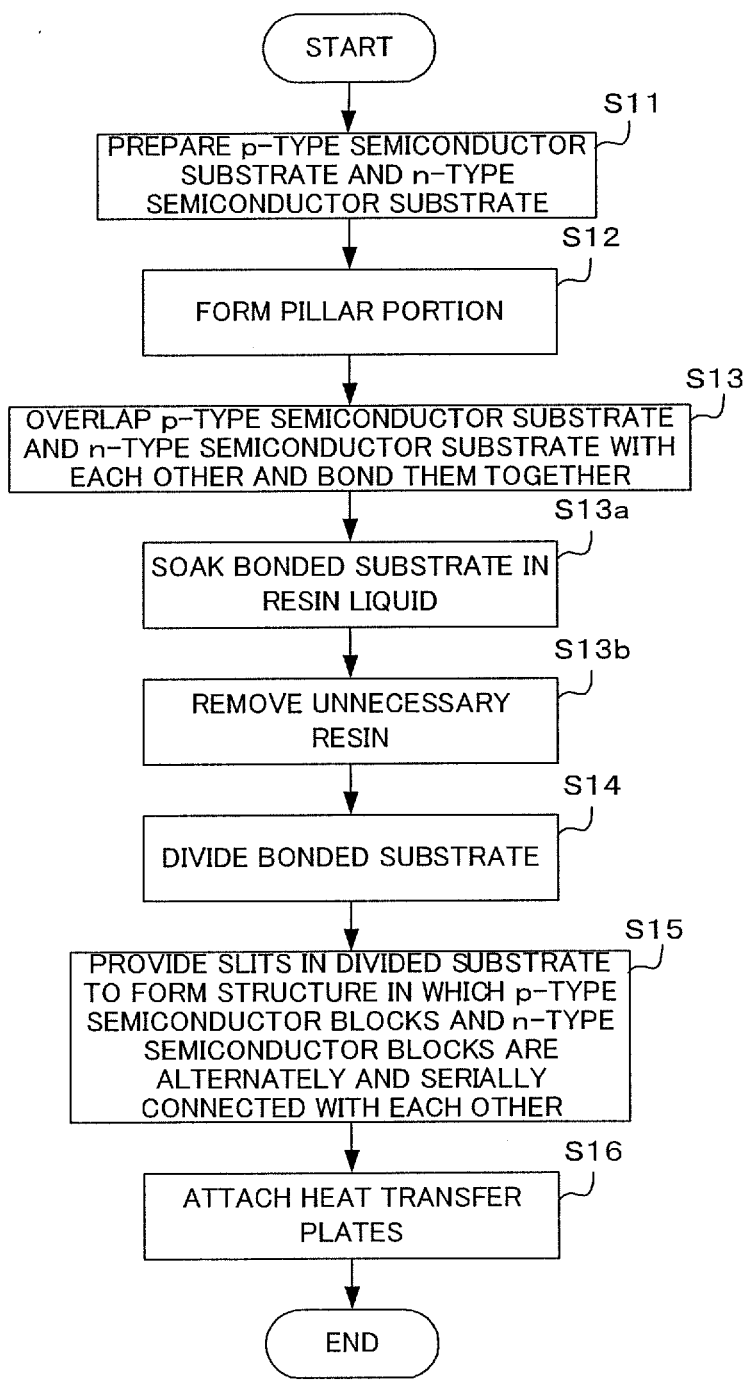
FIG. 14 is a flowchart illustrating a method of manufacturing a thermoelectric conversion module according to a third embodiment.

FIG. 14 is a flowchart illustrating a method of manufacturing a thermoelectric conversion module according to a third embodiment. The embodiment is different from the manufacturing method according to the first embodiment (see FIG. 2) in that steps S13a, S13b are added. Other steps are basically the same as those of the first embodiment and thus the duplicated description is omitted here.

In the embodiment, as illustrated in FIGS. 5A, 5B and 6, a bonded substrate 25 is made by bonding a p-type semiconductor substrate 21 and an n-type semiconductor substrate 22 together, and then the bonded substrate 25 is soaked in resin liquid in a decompression chamber, for example (step S13a). Accordingly, resin is filled into gaps between pillar portions 11a, 12a. As for the resin, resin with high heat insulating properties and insulation properties is preferable. For example, urethane or other synthetic rubber may be used.

Next, the bonded substrate 25 is taken out from the resin liquid and the resin is hardened. Then, the resin adhered to the outside of the bonded substrate 25 is removed by polishing or the like (step S13b).

The processes thereafter are the same as those of the first embodiment, and thus the description thereof is omitted. Note that as described in the second embodiment, a metal layer may be provided between p-type semiconductor blocks 11 and n-type semiconductor blocks 12.

Figure 15:
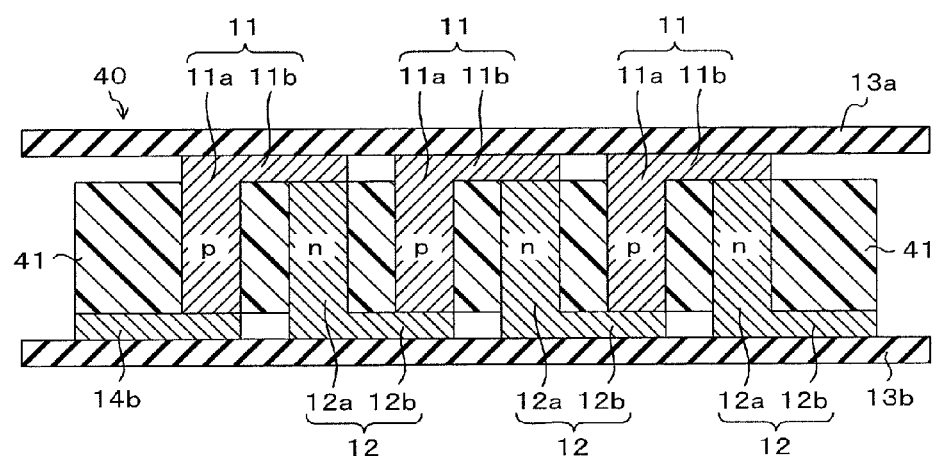
FIG. 15 is a schematic diagram illustrating a thermoelectric conversion module according to the third embodiment.

FIG. 15 is a schematic diagram illustrating a thermoelectric conversion module 40 manufactured according to the above-described method. In the first and second embodiments, a void is present between the pillar portion 11a of each p-type semiconductor block 11 and the pillar portion 12a of the adjacent n-type semiconductor block 12. On the other hand, in this embodiment, insulating resin (filler) 41 is filled in gaps between the pillar portions 11a of the p-type semiconductor blocks 11 and the pillar portions 12a of the n-type semiconductor blocks 12. Accordingly, the mechanical strength of the thermoelectric conversion module 40 is increased, so that breakage and damage in use are suppressed. The embodiment also has such an advantage that breakage and damage during the manufacturing processes are avoided and therefore a manufacturing yield of a thermoelectric conversion module is improved.

(Fourth Embodiment)

Figure 16:
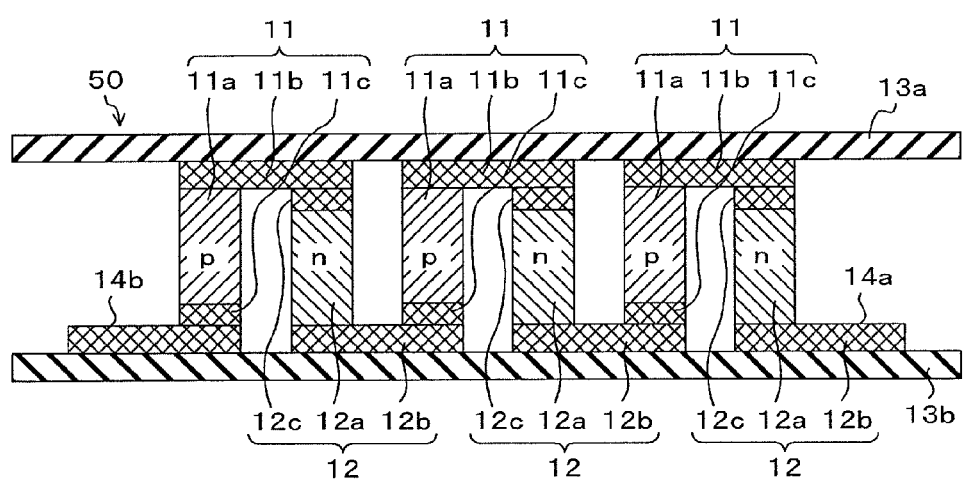
FIG. 16 is a cross-sectional view illustrating a thermoelectric conversion module according to a fourth embodiment.

FIG. 16 is a schematic diagram of a thermoelectric conversion module according to a fourth embodiment. The embodiment is different from the first embodiment in that tip-end portions 11c, 12c and connection portions 11b, 12b of pillar portions 11a, 12a of p-type semiconductor blocks 11 and n-type semiconductor blocks 12 are made of a thermoelectric conversion material containing metal powder. In FIG. 16, components which are the same as those of FIG. 1 are given the same reference numerals, and the detailed description thereof is omitted.

In the thermoelectric conversion module 10 according to the first embodiment, the p-type semiconductor blocks 11 and the n-type semiconductor blocks 12 are directly bonded together. For this reason, depending on the conditions for hot pressing or on which thermoelectric conversion material is used, sufficient adhesiveness is not to be obtained in the bonded portions of the p-type semiconductor blocks 11 and the n-type semiconductor blocks 12, which may cause a problem such as an increase of electric resistance of the bonded portion.

On the other hand, in a thermoelectric conversion module 50 according to the embodiment, the tip-end portions (end portions which are on the opposite side of the connection portions 11b, 12b) 11c, 12c of the pillar portions 11a, 12a and the connection portions 11b, 12b are made of a thermoelectric conversion material containing metal powder. Accordingly, adhesiveness of the bonded portions of the p-type semiconductor blocks 11 and the n-type semiconductor blocks 12 is improved, which suppresses an increase of electric resistance in the bonded portions. In addition, the electric resistance of the connection portions 11b, 12b is decreased by the metal powder contained in the connection portions 11b, 12b, so that internal resistance of the thermoelectric conversion module 50 may be further reduced.

Figure 17:
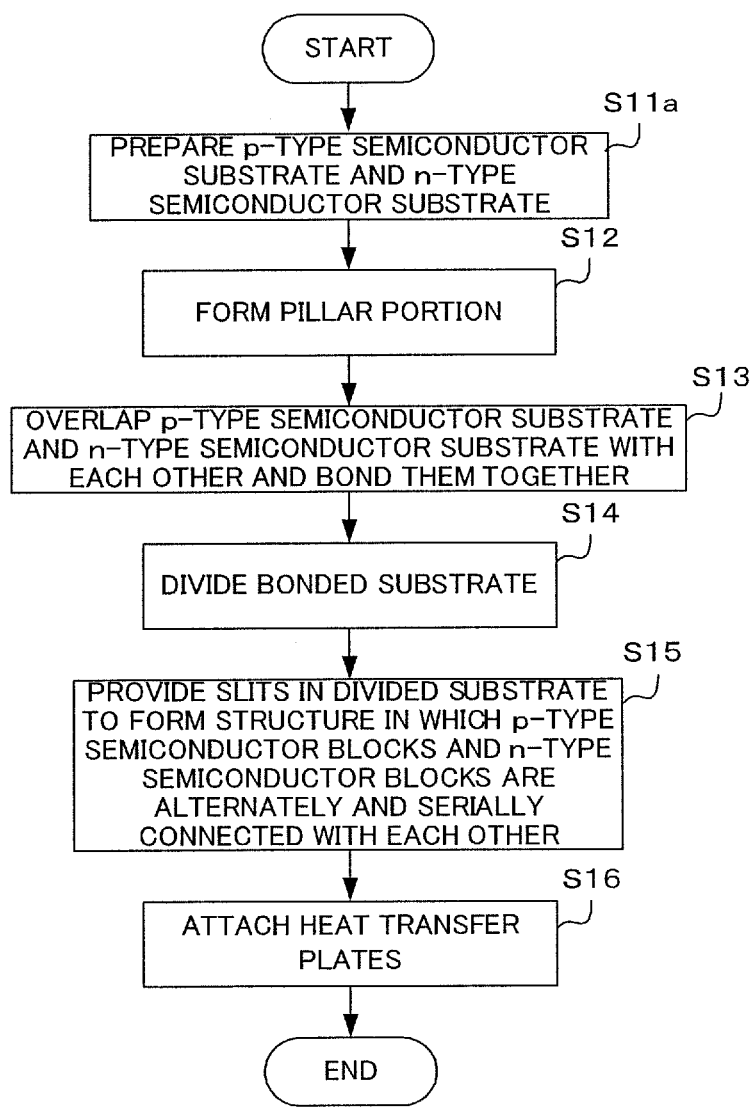
FIG. 17 is a flowchart illustrating a method of manufacturing the thermoelectric conversion module according to the fourth embodiment.

FIG. 17 is a flowchart illustrating a method of manufacturing the thermoelectric conversion module 50 according to the embodiment. FIGS. 18, 19, 20A and 20B are drawings which illustrate the method of manufacturing the thermoelectric conversion module 50 according to the embodiment in the order of steps taken. The manufacturing method according to the embodiment is different from the manufacturing method according to the first embodiment in a process (step S11a) of making a thermoelectric conversion material substrate. Other processes are basically the same as those of the first embodiment, and thus the detailed description of the duplicated portions is omitted.

Figure 18:
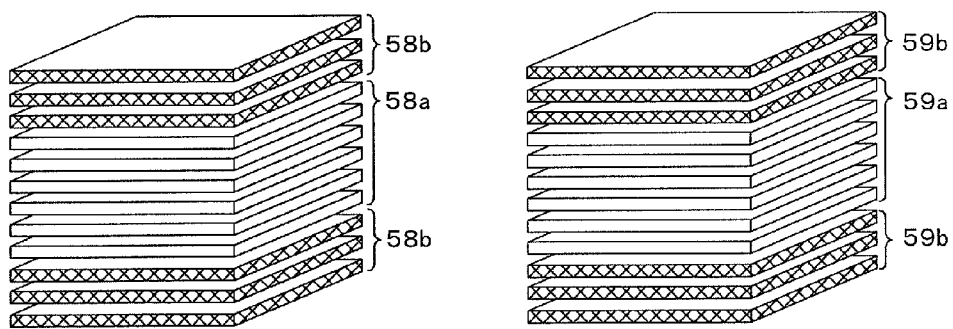
FIG. 18 is a drawing (No. 1) illustrating the method of manufacturing the thermoelectric conversion module according to the fourth embodiment.

First, at step S11a, to form a p-type semiconductor substrate 53, as illustrated in FIG. 18, a green sheet 58a which is formed by adding binder and plasticizer to $Ca_3Co_4O_9$ and a green sheet 58b which is formed by adding metal power, binder, and plasticizer to $Ca_3Co_4O_9$ are prepared. In the embodiment, the green sheets 58a, 58b each have a thickness of 100 μm. Moreover, Ag (silver) power is used as the metal powder because it has low electric resistivity and low reactivity with a thermoelectric conversion material. Note that in place of Ag powder, powder of Ag—Pd (silver-palladium) alloy, Pt (platinum), Co (cobalt), Mn (manganese), or the like may be added. Further, polyvinyl butyral (PVB) or the like is used as the binder and dibutyl phthalate or the like is used as the plasticizer. Table 1 illustrates one example of compositions of the green sheets 58a, 58b.

TABLE 1

| | $Ca_3Co_4O_9$ | Ag powder | Binder | Plasticizer |
|---|---|---|---|---|
| Green sheet 58a | 93.5 wt % | 0 wt % | 4.7 wt % | 1.8 wt % |
| Green sheet 58b | 84.2 wt % | 9.3 wt % | 4.7 wt % | 1.8 wt % |

In addition, to form an n-type semiconductor substrate 54, a green sheet 59a which is formed by adding binder and plasticizer to $Ca_{0.9}La_{0.1}MnO_3$ and a green sheet 59b which is formed by adding metal powder, binder, and plasticizer to $Ca_{0.9}La_{0.1}MnO_3$ are prepared. Note that the green sheets 59a, 59b also contain binder and plasticizer which are the same as those of the green sheets 58a, 58b and are both formed with a thickness of 100 μm. Table 2 illustrates one example of compositions of the green sheets 59a, 59b.

TABLE 2

| | $Ca_{0.9}La_{0.1}MnO_3$ | Ag powder | Binder | Plasticizer |
|---|---|---|---|---|
| Green sheet 59a | 93.5 wt % | 0 wt % | 4.7 wt % | 1.8 wt % |
| Green sheet 59b | 84.2 wt % | 9.3 wt % | 4.7 wt % | 1.8 wt % |

As illustrated in Tables 1 and 2, in the embodiment, approximately 10 wt % of Ag powder is added to the green sheets 58b, 59b. However, the amount of the metal powder to be added may be less than that. For example, when 3 wt % or more of the metal powder is contained in the green sheets 58b, 59b, the adhesiveness of the bonded portion of the p-type semiconductor blocks 11 and the n-type semiconductor blocks 12 may be improved.

After that, a plurality of the green sheets 58a (for example, 10 sheets) are stacked on top of one another, and one or a plurality of the green sheets 58b (for example, 3 sheets) to which Ag powder is added are further stacked on each of the upper side and the lower side of the laminated green sheets 58a, so that a lamination of the green sheets 58a, 58b is formed.

As similar to the above, a plurality of the green sheets 59a are stacked on top of one another and one or a plurality of the green sheets 59b to which Ag is added are further stacked on each of the upper side and the lower side of the laminated green sheets 59a, so that a lamination of the green sheets 59a, 59b is formed. Note that the number of the green sheets 58a, 58b to be stacked and the number of the green sheets 59a, 59b to be stacked may be set as appropriate.

Figure 19:
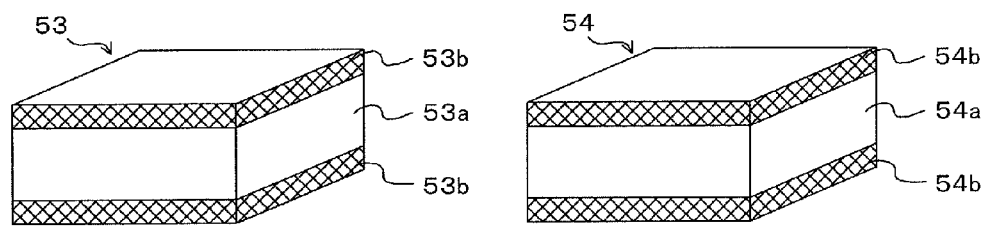
FIG. 19 is a drawing (No. 2) illustrating the method of manufacturing the thermoelectric conversion module according to the fourth embodiment.

Next, the lamination of the green sheets 58a, 58b is heated at a temperature of approximately 500° C. for approximately 4 hours to be degreased, and then is burned at 850° C. to 1000° C. for approximately 3 hours. Accordingly, as illustrated in FIG. 19, a p-type semiconductor substrate 53 having an Ag-containing layer 53b (a second p-type semiconductor layer) on each of upper and lower sides of a $Ca_3Co_4O_9$ thermoelectric conversion material layer 53a (a first p-type semiconductor layer) is obtained.

As similar to the above, the lamination of the green sheets 59a, 59b is degreased and burned, and an n-type semiconductor substrate 54 having an Ag-containing layer 54b (a second n-type semiconductor layer) on each of upper and lower sides of a $Ca_{0.9}La_{0.1}MnO_3$ thermoelectric conversion material layer 54a (a first n-type semiconductor layer) is obtained. At this time, a burning temperature is 1050° C. to 1200° C. In the embodiment, the p-type semiconductor substrate 53 and the n-type semiconductor substrate 54 each have a thickness of approximately 900 μm as well.

Figure 20A:
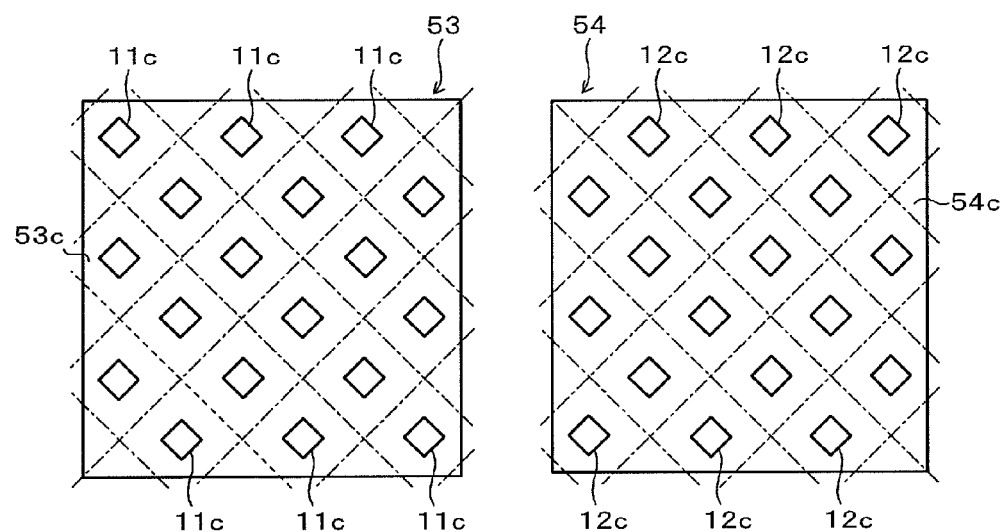
FIG. 20A and FIG. 20B are drawings (No. 3) illustrating the method of manufacturing the thermoelectric conversion module according to the fourth embodiment.
Figure 20B:
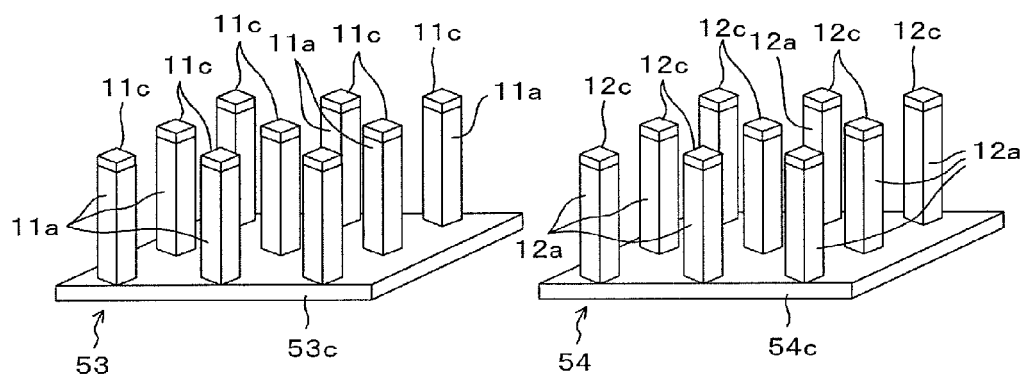

Next, at step S12, as illustrated in a plan view of FIG. 20A and a perspective view of FIG. 20B, slits (grooves) with a depth of 800 μm are provided in a lattice pattern in each of the p-type semiconductor substrate 53 and the n-type semiconductor substrate 54 by a dicing saw. In the p-type semiconductor substrate 53, a quadrangular pillar portion surrounded by the slits (the grooves) becomes a pillar portion 11a of each p-type semiconductor block 11. In the n-type semiconductor substrate 54, a quadrangular pillar portion surrounded by the slits (the grooves) becomes a pillar portion 12a of each n-type semiconductor block 12. These pillar portions 11a, 12a have tip-end portions 11c, 12c containing Ag. In addition, the Ag-containing layers 53b, 54b with a thickness of approximately 100 μm are left in the slit portions (the groove bottom portions), so that thin plate portions 53c, 54c are formed.

Thereafter, as similar to the first embodiment, the p-type semiconductor substrate 53 and the n-type semiconductor substrate 54 are overlapped with each other, which are then heated up to approximately 900° C. to 1000° C. with a pressure of approximately 10 MPa to 50 MPa by means of hot pressing to bond (thermal compression bond) the p-type semiconductor substrate 53 and the n-type semiconductor substrate 54 together. Accordingly, a bonded substrate 55 is formed (step S13). Then, the bonded substrate 55 is cut into pieces of a desired size (step S14).

Next, slits are provided in each of the thin plate portions 53c, 54c of the p-type semiconductor substrate 53 and the n-type semiconductor substrate 54 by the dicing saw or the like so that the p-type semiconductor blocks 11 and the n-type semiconductor blocks 12 are alternately connected in series, thereby forming a semiconductor block set (step S15). After that, heat transfer plates 13a, 13b are attached to the semiconductor block set by a thermal conductive adhesive for example (step S16), so that the thermoelectric conversion module 50 according to the embodiment as illustrated in FIG. 16 is completed.

In the thermoelectric conversion module 50 according to the embodiment, the end portions 11c, 12c near the bonded portions of the p-type semiconductor blocks 11 and the n-type semiconductor blocks 12 and the thin plate portions 53c, 54c (the connection portions 11b, 12b) are made of a thermoelectric conversion material containing Ag powder (metal powder). Thus, when the p-type semiconductor substrate 53 and the n-type semiconductor substrate 54 are bonded together, Ag near the bonded portion is coupled, and the p-type semiconductor blocks 11 and the n-type semiconductor blocks 12 are bonded together by the coupled Ag. Accordingly, the adhesiveness of the bonded portions of the p-type semiconductor blocks 11 and the n-type semiconductor blocks 12 is improved, and an increase of electric resistance in the bonded portions may be suppressed.

The thermoelectric conversion module according to the embodiment is actually manufactured and the thermoelectric power generation characteristic thereof is studied. A size of the thermoelectric conversion module is approximately 2 mm×2 mm and a thickness thereof is approximately 1 mm. In addition, the number of the p-type semiconductor blocks 11 and the number of the n-type semiconductor blocks 12 are both 100 (100 pairs). A temperature on one heat transfer plate side of the thermoelectric conversion module is a room temperature and a temperature on the other heat transfer plate side is a temperature which is 10° C. higher than the room temperature. As a result, a voltage of approximately 0.1V is generated between output terminals.

Note that although the embodiment illustrates an example in which the p-type semiconductor substrate 53 and the n-type semiconductor substrate 54 are manufactured by a method using green sheets (a green sheet method) at step S11a, the p-type semiconductor substrate 53 and the n-type semiconductor substrate 54 may be manufactured by other methods. For example, the semiconductor substrates 53, 54 may be manufactured in such a manner that a p-type semiconductor substrate 21 and an n-type semiconductor substrate 22 which are the same as those of the first embodiment (see, FIG. 3) are prepared, then slurry containing a thermoelectric conversion material and metal powder is applied onto upper and lower sides of each of these semiconductor substrates, and then the resultant substrates are degreased and burned.

(Fifth Embodiment)

Figure 21:
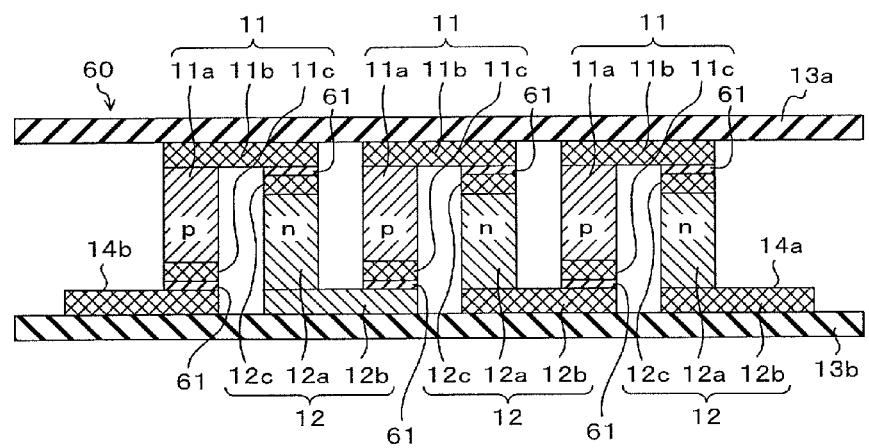
FIG. 21 is a cross-sectional view illustrating a thermoelectric conversion module according to a fifth embodiment.

FIG. 21 is a schematic diagram of a thermoelectric conversion module according to a fifth embodiment. The embodiment is different from the fourth embodiment in that a metal layer 61 is provided in each of bonded portions of p-type semiconductor blocks 11 and n-type semiconductor blocks 12. Other structures are basically the same as those of the fourth embodiment. Thus, components in FIG. 21 which are the same as those in FIG. 16 are given the same reference numerals, and the detailed description thereof is omitted.

In a thermoelectric conversion module 60 according to the embodiment, a metal layer 61 made of Ag (silver) or the like is provided in each of the bonded portions of the p-type semiconductor blocks 11 and the n-type semiconductor blocks 12, so that elements of the p-type semiconductor blocks 11 and the n-type semiconductor blocks 12 are prevented from migrating into the other block. Accordingly, an electric characteristic near the bonded portions of the p-type semiconductor blocks 11 and the n-type semiconductor blocks 12 is further stabilized, and thus the reliability of the thermoelectric conversion module is improved.

FIGS. 22, 23, 24A and 24B are drawings which illustrate a method of manufacturing the thermoelectric conversion module 60 according to the embodiment in the order of steps taken.

Figure 22:
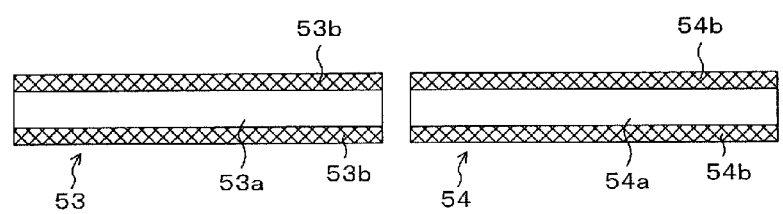
FIG. 22 is a drawing (No. 1) illustrating a method of manufacturing the thermoelectric conversion module according to the fifth embodiment.

In the embodiment, as illustrated in a cross-sectional view of FIG. 22, a p-type semiconductor substrate 53 having an Ag-containing layer 53b on each of upper and lower sides of a $Ca_3Co_4O_9$ thermoelectric conversion material layer 53a is prepared. In addition, an n-type semiconductor substrate 54 having an Ag-containing layer 54b on each of upper and lower sides of a $Ca_{0.9}La_{0.1}MnO_3$ thermoelectric conversion material layer 54a is prepared. In the embodiment, the p-type semiconductor substrate 53 and the n-type semiconductor substrate 54 each have a thickness of approximately 900 μm as well. Note that the p-type semiconductor substrate 53 and the n-type semiconductor substrate 54 are manufactured by a method the same as that described in the fourth embodiment (see, FIGS. 18 and 19).

Figure 23:
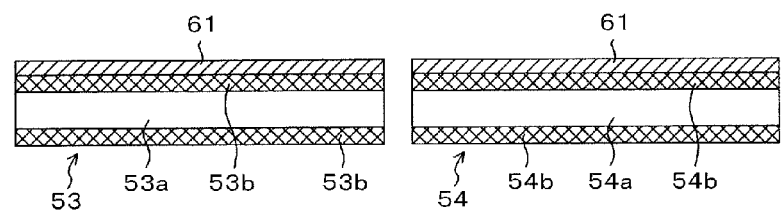
FIG. 23 is a drawing (No. 2) illustrating the method of manufacturing the thermoelectric conversion module according to the fifth embodiment.

Next, as illustrated in a cross-sectional view of FIG. 23, a metal layer 61 is formed with a thickness of, for example, 2 μm on one surface of each of the p-type semiconductor substrate 53 and the n-type semiconductor substrate 54. In the embodiment, the metal layer 61 is formed of a first Ag layer formed with a thickness of 0.5 μm by a vacuum deposition method and a second Ag layer formed by applying Ag paste thereon with a thickness of 1.5 μm. After the metal layer 61 is formed as described above, heat treatment is performed at a temperature of approximately 800° C. for 10 minutes, for example. Note that, in the embodiment, the metal layer 61 is made of Ag, but a metal layer may be made of Au (gold), solder, or the like.

Figure 24A:
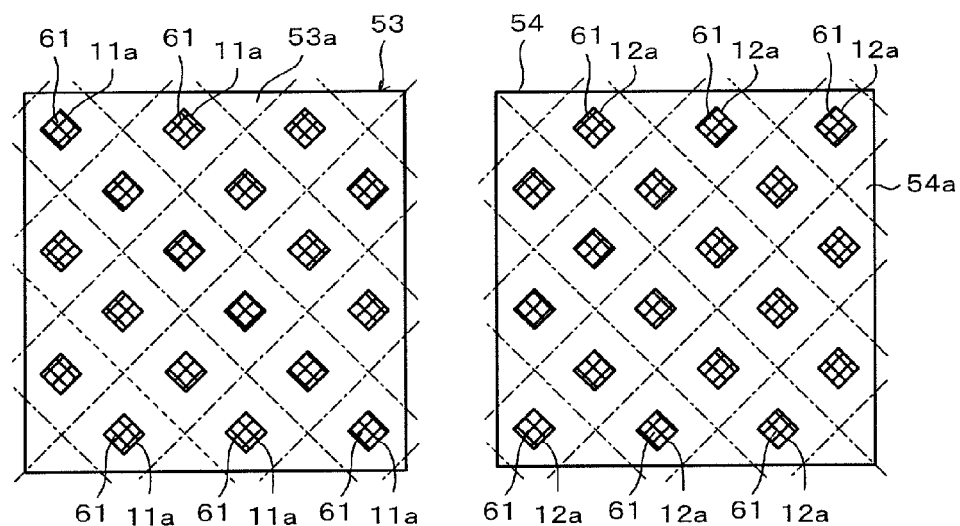
FIG. 24A and FIG. 24B are drawings (No. 3) illustrating the method of manufacturing the thermoelectric conversion module according to the fifth embodiment.
Figure 24B:
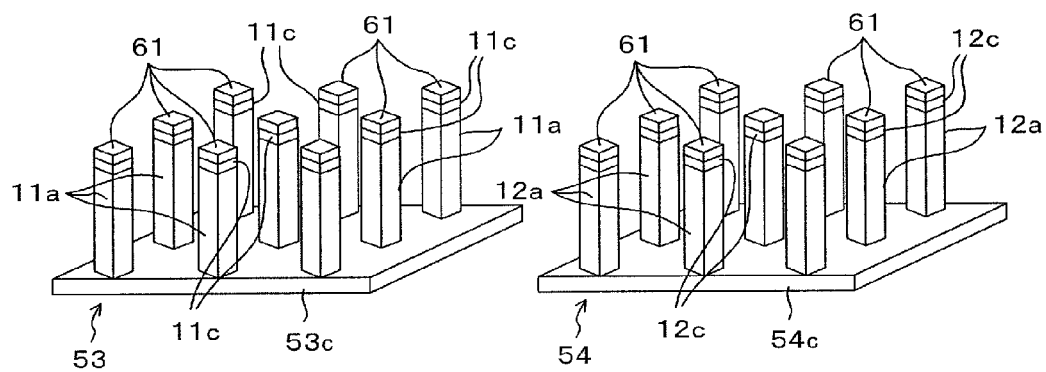

Next, as illustrated in a top view of FIG. 24A and a perspective view of FIG. 24B, slits (grooves) with a depth of 800 μm are provided in a lattice pattern in each of the p-type semiconductor substrate 53 and the n-type semiconductor substrate 54 by a dicing saw. In the p-type semiconductor substrate 53, a quadrangular pillar portion surrounded by the slits (the grooves) becomes a pillar portion 11a of each p-type semiconductor block 11. In the n-type semiconductor substrate 54, a quadrangular pillar portion surrounded by the slits (the grooves) becomes a pillar portion 12a of each n-type semiconductor block 12. Tip-end portions 11c, 12c of these pillar portions 11a, 12a are each covered with the metal layer 61.

Thereafter, as similar to the fourth embodiment, the p-type semiconductor substrate 53 and the n-type semiconductor substrate 54 are overlapped with each other. Then, heat treatment is performed at a temperature of 700° C. to 900° C., for example, to bond the p-type semiconductor substrate 53 and the n-type semiconductor substrate 54 with the metal layer 61 in between, thereby forming a bonded substrate. In this case, a certain level of pressure may be applied to the semiconductor substrates 53, 54 in order to increase bonding strength.

Next, as similar to the fourth embodiment, the bonded substrate is cut into pieces of a desired size. Then, slits are provided in each of thin plate portions 53c, 54c of the p-type semiconductor substrate 53 and the n-type semiconductor substrate 54 by the dicing saw or the like so that the p-type semiconductor blocks 11 and the n-type semiconductor blocks 12 are alternately connected in series, thereby forming a semiconductor block set. After that, heat transfer plates 13a, 13b are attached to the semiconductor block set by a thermal conductive adhesive, for example, so that the thermoelectric conversion module 60 according to the embodiment as illustrated in FIG. 21 is completed.

As described above, also in the embodiment, the tip-end portions 11c, 12c and the connection portions 11b, 12b of the pillar portions 11a, 12a of the p-type semiconductor blocks 11 and the n-type semiconductor blocks 12 contain metal powder, so that effects the same as those of the fourth embodiment may be obtained.

In addition, the metal layer 61 is provided in each of the bonded portions of the p-type semiconductor blocks 11 and the n-type semiconductor blocks 12, so that elements of the p-type semiconductor blocks 11 and the n-type semiconductor blocks 12 are prevented from spreading into the other block. Accordingly, an electric characteristic of the p-type semiconductor blocks 11 and the n-type semiconductor blocks 12 is stabilized, and thus the thermoelectric conversion module 60 with high reliability may be obtained.

The thermoelectric conversion module according to the embodiment is actually manufactured and the thermoelectric power generation characteristic thereof is studied. A size of the thermoelectric conversion module is approximately 2 mm×2 mm and a thickness thereof is approximately 1 mm. In addition, the number of the p-type semiconductor blocks 11 and the number of the n-type semiconductor blocks 12 are both 100 (100 pairs). A temperature on one heat transfer plate side of the thermoelectric conversion module is a room temperature and a temperature on the other heat transfer plate side is a temperature which is 10° C. lower than the room temperature. As a result, a voltage of approximately 0.1V is generated between output terminals.

(Sixth Embodiment)

Figure 25:
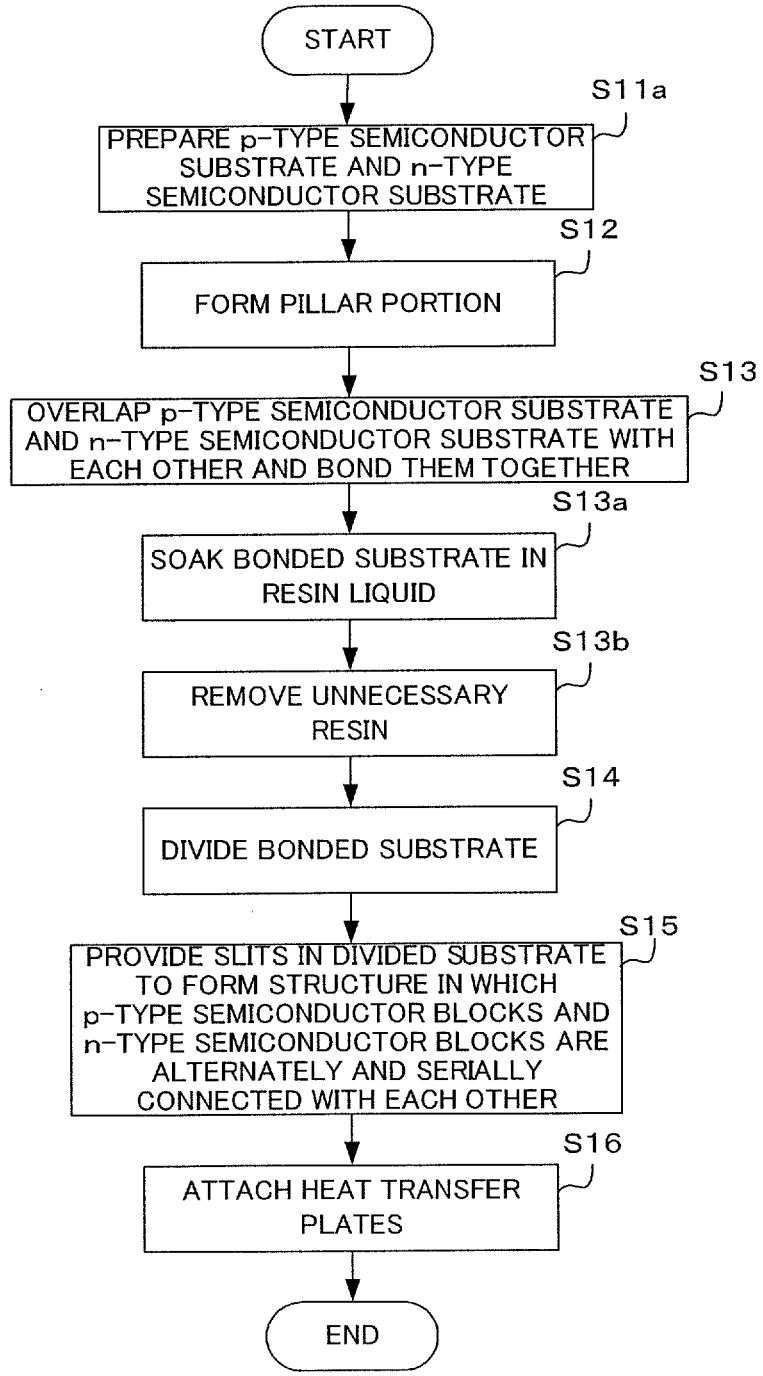
FIG. 25 is a flowchart illustrating a method of manufacturing a thermoelectric conversion module according to a sixth embodiment.

FIG. 25 is a flowchart illustrating a method of manufacturing a thermoelectric conversion module according to a sixth embodiment. The manufacturing method according to the embodiment is different from the manufacturing method according to the fourth embodiment (see, FIG. 17) in that steps S13a, S13b are added. Other steps are basically the same as those of the fourth embodiment, and thus the description of duplicated portions is omitted.

In the embodiment, a p-type semiconductor substrate 53 and an n-type semiconductor substrate 54 are bonded together to form a bonded substrate in step S13 of the fourth embodiment, and, thereafter, the bonded substrate is soaked in resin liquid in a decompression chamber, for example (step S13a). Accordingly, resin is filled into gaps between pillar portions 11a, 12a.

Next, the bonded substrate is taken out from the resin liquid and the resin is hardened. Then, the resin adhered to the outside of the bonded substrate is removed by polishing or the like (step S13b). The processes thereafter are the same as those of the fourth embodiment, and thus the description thereof is omitted. Note that as described in the fifth embodiment, a metal layer 61 may be provided between p-type semiconductor blocks 11 and n-type semiconductor blocks 12.

Figure 26:
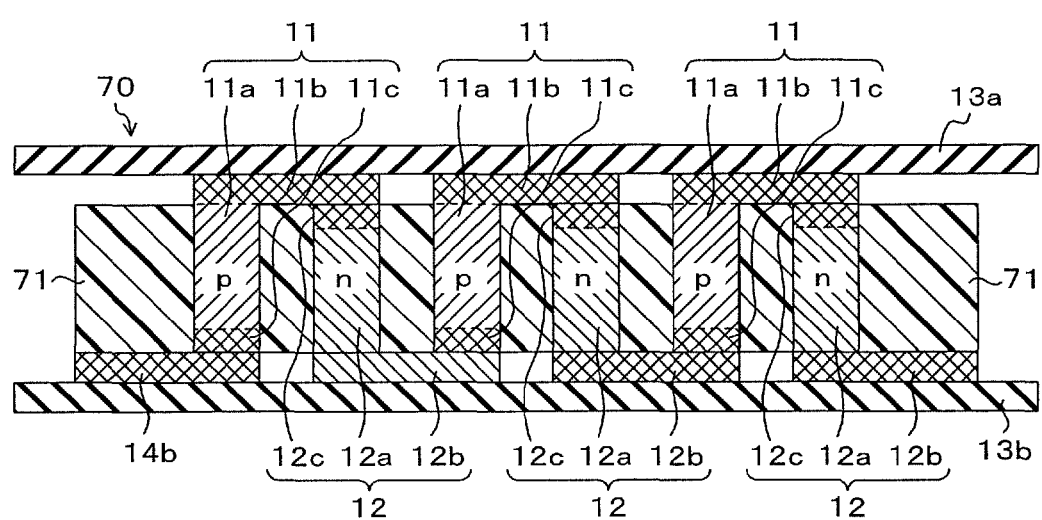
FIG. 26 is a schematic diagram illustrating the thermoelectric conversion module according to the sixth embodiment.

FIG. 26 is a schematic diagram of a thermoelectric conversion module 70 which is manufactured by the above-described method. Also in the embodiment, tip-end portions 11c, 12c and connection portions 11b, 12b of the pillar portions 11a, 12a of the p-type semiconductor blocks 11 and the n-type semiconductor blocks 12 contain metal powder, so that effects the same as those of the fourth embodiment may be obtained.

In addition, insulating resin 71 is filled in the gaps between the pillar portions 11a of the p-type semiconductor blocks 11 and the pillar portions 12a of the n-type semiconductor blocks 12. Accordingly, the mechanical strength of the thermoelectric conversion module 70 is increased, so that breakage and damage in use are suppressed. The embodiment also has such an advantage that breakage and damage during the manufacturing processes are avoided and therefore a manufacturing yield of a thermoelectric conversion module is improved.

The thermoelectric conversion module according to the embodiment is actually manufactured and the thermoelectric power generation characteristic thereof is studied. A size of the thermoelectric conversion module is approximately 2 mm×2 mm and a thickness thereof is approximately 1 mm. In addition, the number of the p-type semiconductor blocks 11 and the number of the n-type semiconductor blocks 12 are both 100 (100 pairs). A temperature on one heat transfer plate side of the thermoelectric conversion module is a room temperature and a temperature on the other heat transfer plate side is a temperature which is 10° C. lower than the room temperature. As a result, a voltage of approximately 0.1V is generated between output terminals.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A thermoelectric conversion module, comprising:
   a plurality of p-type semiconductor blocks, each being made of a p-type thermoelectric conversion material, each having a first pillar portion and a first connection portion laterally protruding from one end portion of the first pillar portion, and each containing metal powder in the first connection portion and a different end portion of the first pillar portion; and
   a plurality of n-type semiconductor blocks, each being made of an n-type thermoelectric conversion material, each having a second pillar portion and a second connection portion laterally protruding from one end portion of the second pillar portion, and each containing metal powder in the second connection portion and a different end portion of the second pillar portion,
   wherein the first connection portion of each p-type semiconductor block overlaps longitudinally and is connected with the different end portion of the second pillar portion of the corresponding n-type semiconductor block, the second connection portion of each n-type semiconductor block overlaps longitudinally and is connected with the different end portion of the first pillar portion of the corresponding p-type semiconductor block, so that the plurality of p-type semiconductor blocks and the plurality of n-type semiconductor blocks are alternately connected in series.

2. The thermoelectric conversion module according to claim 1, wherein a metal layer is provided between the first connection portion and the second pillar portion and between the second connection portion and the first pillar portion.

3. The thermoelectric conversion module according to claim 1, further comprising a pair of heat transfer plates being disposed to hold the plurality of p-type semiconductor blocks and the plurality of n-type semiconductor blocks between the pair of heat transfer plates, wherein the first connection portions of the plurality of p-type semiconductor blocks are all disposed on a side of one of the pair of heat transfer plates and the second connection portions of the plurality of n-type semiconductor blocks are all disposed on a side of the other one of the pair of heat transfer plates.

4. The thermoelectric conversion module according to claim 1, wherein both the first pillar portion and the second pillar portion are formed in a quadrangular pillar shape, and each adjacent p-type semiconductor block and n-type semiconductor block are arranged such that corner portions of the first pillar portion and the second pillar portion face each other.

5. The thermoelectric conversion module according to claim 1, wherein the plurality of p-type semiconductor blocks and the plurality of n-type semiconductor blocks are arranged in a lattice pattern.

6. The thermoelectric conversion module according to claim 1, wherein the first connection portion and the second connection portion are in the form of a plate.

7. The thermoelectric conversion module according to claim 1, wherein a width of each of the first and second connection portions is larger than a width of a corresponding one of the first and second pillar portions.

8. The thermoelectric conversion module according to claim 5, semiconductor blocks arranged in a peripheral portion among the p-type semiconductor blocks and the n-type semiconductor blocks arranged in a lattice pattern each have a conductivity type different from a conductivity type of the adjacent semiconductor block.

9. The thermoelectric conversion module according to claim 1, wherein an insulating filler is filled in a space between the first pillar portion and the second pillar portion.

10. The thermoelectric conversion module according to claim 1, wherein the p-type thermoelectric conversion material is made of a compound containing any one of $Ca_3Co_4O_9$, $Na_xCoO_2$, and $Ca_{3-x}Bi_xCo_4O_9$ as a principal component, and the n-type thermoelectric conversion material is made of a compound containing any one of $Ca_{0.9}La_{0.1}MnO_3$, $La_{0.9}Bi_{0.1}NiO_3$, $CaMn_{0.98}Mo_{0.02}O_3$, and Nb-doped $SrTiO_3$ as a principal component.

11. The thermoelectric conversion module according to claim 1, wherein the metal powder is made of a metal containing any one of Ag (silver), an Ag—Pd (silver-palladium) alloy, Pt (platinum), Co (cobalt), and Mn (manganese) as a principal component.

* * * * *